United States Patent [19]
Philippi

[11] Patent Number: 5,450,959
[45] Date of Patent: Sep. 19, 1995

[54] APPARATUS FOR USE IN SEPARATING PARTS FROM A PANEL ARRAY OF PARTS

[75] Inventor: Keith C. Philippi, Manitowoc, Wis.

[73] Assignee: Paragon Electric Company, Inc., Two Rivers, Wis.

[21] Appl. No.: 297,971

[22] Filed: Aug. 30, 1994

[51] Int. Cl.⁶ .............................................. B65D 85/30
[52] U.S. Cl. .................................. 206/706; 206/564; 206/503; 206/709; 206/725
[58] Field of Search ............... 206/328, 329, 332, 564, 206/503

[56] References Cited

U.S. PATENT DOCUMENTS

| | | | |
|---|---|---|---|
| 4,671,407 | 6/1987 | Brutosky | 206/564 X |
| 4,722,440 | 2/1988 | Johnston | 206/564 X |
| 5,012,925 | 5/1991 | Gallagher, Sr. | 206/564 X |
| 5,103,976 | 4/1992 | Murphy | 206/328 |
| 5,305,879 | 4/1994 | Noschese | 206/564 X |
| 5,360,109 | 11/1994 | Janota | 206/564 X |

*Primary Examiner*—Jacob K. Ackun
*Attorney, Agent, or Firm*—Foley & Lardner

[57] ABSTRACT

An apparatus for use in manufacturing an array of parts, such as printed circuit boards arranged in a multi-board panel. The array includes a plurality of the parts joined by frangible connections at a plurality of connection sites, and comprises a receptacle having a profiled upper face configured to generally retain the array in the receptacle in a predetermined orientation with each respective part having a predetermined locus when the array is in the predetermined orientation. The receptacle includes a plurality of apertures traversing the receptacle which are substantially in register with the connection sites when the array is in the predetermined orientation. The apertures are configured to accommodate punching severance of the frangible connections and passing of punched material from the punching severance through the apertures. In its preferred embodiment, the profiled upper face is configured to generally retain each respective part in the predetermined locus after severance of the parts from the array, and the receptacle is configured to facilitate stacking of receptacles with parts retained in the predetermined loci in each of the adjacent stacked receptacles.

14 Claims, 3 Drawing Sheets

APPARATUS FOR USE IN SEPARATING PARTS FROM A PANEL ARRAY OF PARTS

BACKGROUND OF THE INVENTION

Often in the production of parts, such as printed circuit boards, an array of such parts is produced in such manner that they are easily separable into individual parts by a stamping, routing, or similar process. The array of parts may be kept intact during such operations as parts stuffing, wave soldering, and the like, and may even be maintained in one piece through testing procedures. Eventually individual parts are separated from the array of parts and the individual parts are packaged for shipping.

In the past, prior art devices in the form of trays or similar configurations have been used to hold parts arrays for transport among various manufacturing or testing stations and operations. Separation of the parts arrays into individual parts generates scrap or waste which in the past has collected in the tray or other transporting apparatus. Thus, the individual parts must be separated from the tray in order that the waste materials may be discarded. The individual parts are then packaged for shipping, often in anti-static material shipping trays.

One example of a prior art approach to handling parts arrays and separating such parts arrays into individual parts in a manufacturing environment is disclosed in U.S. Pat. No. 5,117,554 to Grabow. Grabow's system provides for liberating individual printed circuit boards from a multi-board panel by routing tabs, webs, or the like. The liberated boards and scrap generated by the separating operation are transported in a tray to an unloading station for removal of the liberated boards and scrap from the tray. Thus, labor must be expended in unloading the tray and in reloading the liberated boards into some other conveyance for further processing or for shipment. Labor costs in manufacture are a significant percentage of the total cost of manufacture; thus, labor costs present opportunities for saving manufacture costs. It would be advantageous if one could save labor in various areas of the manufacturing process.

It would, for example, be advantageous if a single tray or other apparatus could be used to convey an array of parts through at least a portion of a manufacturing process among a plurality of manufacturing or testing steps, including a step involving separation of the parts array into individual parts, without accumulating waste materials from such separation within the tray.

It would also be advantageous if the same tray could be used for conveying the array of parts and the individual parts through the manufacturing steps and stations and also serve as a shipping container for the individual parts upon completion of the manufacturing process.

SUMMARY OF THE INVENTION

The invention is an apparatus for use in manufacturing an array of parts, such as printed circuit boards arranged in a multi-board panel. The array includes a plurality of the parts joined by a plurality of frangible connections at a plurality of connection sites. The apparatus comprises a receptacle having a profiled upper face configured to generally retain the array in the receptacle in a predetermined orientation with each respective part of the plurality of parts having a predetermined respective locus when the array is in the predetermined orientation. The receptacle includes a plurality of apertures traversing the receptacle, which apertures are substantially in register with the plurality of connection sites when the array is in the predetermined orientation. The plurality of apertures is configured to accommodate punching severance of the frangible connections and passing of punched material from the punching severance through the plurality of apertures. In its preferred embodiment, the profiled upper face is further configured to generally retain each respective part in the predetermined locus after severance of the parts from the array. The receptacle is preferably configured to facilitate stacking of adjacent such receptacles with the plurality of parts retained in the predetermined loci in each of the adjacent stacked receptacles.

In its most preferred embodiment, the receptacle is manufactured of anti-static material.

It is, therefore, an object of the present invention to provide an apparatus for use in manufacturing an array of parts including a plurality of said parts joined by a plurality of frangible connections at a plurality of connection sites which serves to transport the array of parts during at least a portion of the manufacturing or testing process and serves as a shipping container for the plurality of parts after separation of the parts from the array by fracture of the plurality of frangible connections.

It is a further object of the present invention to provide an apparatus for use in manufacturing an array of parts including a plurality of the parts joined by a plurality of frangible connection at a plurality of connection sites which does not collect waste from fracturing the frangible connections during separation of the array of parts into individual parts.

Further objects and features of the present invention will be apparent from the following specification and claims when considered in connection with the accompanying drawings illustrating the preferred embodiment of the invention.

DETAILED DESCRIPTION OF THE INVENTION

Figure 1:
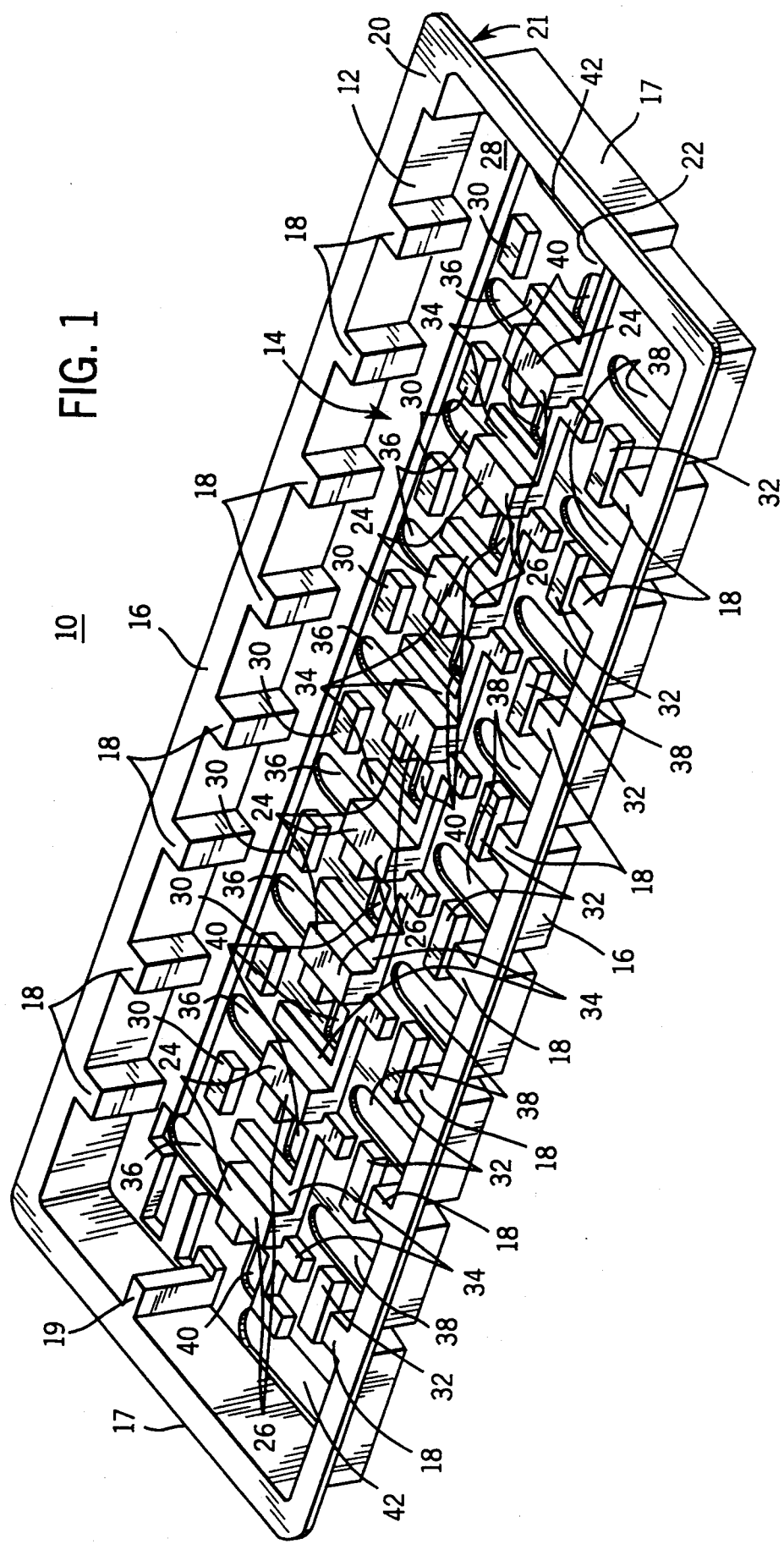
FIG. 1 is a perspective view of the preferred embodiment of the present invention.

FIG. 1 is a perspective view of the preferred embodiment of the present invention. In FIG. 1, an apparatus or tray 10 is illustrated as a multi-level molded part including a wall 12 which substantially surrounds a well 14 having a substantially planar bottom 22. Well 14 is substantially rectangular in shape and is bounded by a pair of longitudinal wall segments 16, from which depend a plurality of spacers 18, and a pair of transverse wall segments 17, from which depend spacers 19. Spacers 18, longitudinal wall segments 16, spacers 19, and transverse wall segments 17 terminate in an upper terminus 20. Upper terminus 20 lies substantially in a plane 21 parallel with bottom 22 of well 14. Configuring upper terminus 20 in a plane 21 facilitates stacking of trays 10 for storage or shipping.

A plurality of central pillars 24 each terminates in a substantially planar upper face 26. All upper faces 26 lie substantially in a plane which may be coplanar with plane 21 containing upper terminus 20 or may, preferably, lie slightly below and parallel with plane 21.

Associated with each longitudinal wall segment 16 is a support shelf 28 (only one support shelf 28 is visible in FIG. 1) which preferably lies in a plane substantially parallel with plane 21 and below the plane containing upper faces 26. Situated within well 14 is a plurality of support structures including support blocks 30, support blocks 32, and support webs 34. Support blocks 30, support blocks 32, and support webs 34 terminate at their upper ends substantially in the plane containing support shelves 28, thereby presenting a plurality of support areas appropriate to support a planar member within well 14. Such a planar member may, for example, be an array of parts appropriately configured to nestle among longitudinal wall segments 16, spacers 18, transverse wall segments 17, spacers 19, and central pillars 24. An appropriately configured planar member would lie on shelves 28, support blocks 30, support blocks 32, and support webs 34; the planar member would be restrained from significant horizontal displacement within well 14 by longitudinal wall segments 16, spacers 18, transverse wall segments 17, spacers 19, and central pillars 24.

Tray 10 further includes a plurality of apertures including first transverse apertures 36, second transverse apertures 38, central apertures 40 and end apertures 42. The various apertures 36, 38, 40, 42 are oriented substantially in register with the plurality of connection sites at which the frangible connections connecting individual parts to form the array of parts are located when the array of parts is nestlingly situated within the tray 10 as described above: that is, nestled among longitudinal wall segments 16, pillars 18, transverse wall segments 17, pillars 19, and central pillars 24, and resting on the various support structures 36, 38, 40, 42.

In order to facilitate understanding the present invention, like elements will be identified by like reference numerals in the various drawings.

Figure 2:
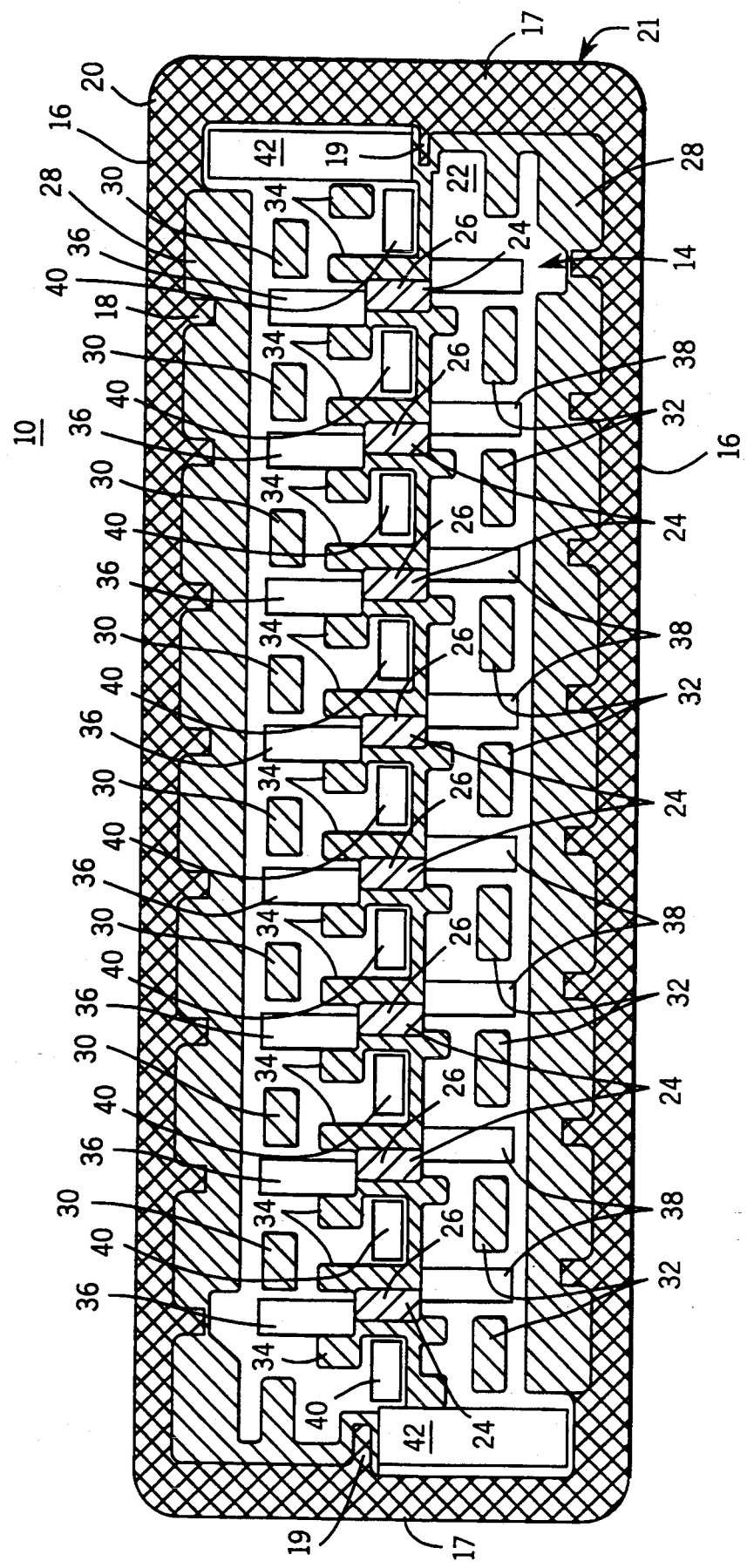
FIG. 2 is a top plan view of the preferred embodiment of the present invention.

FIG. 2 is a top plan view of the preferred embodiment of the present invention. In FIG. 2, tray 10 is illustrated with selected cross-hatching to represent the various planes within tray 10.

Upper terminus 20 and its plurality of integral spacers 18, 19 lies substantially in plane 21, indicated by double cross hatching in FIG. 2.

Upper faces 26 of central pillars 24 preferably lie in a second plane substantially parallel with plane 21 and indicated in a left-high-to-right-low cross hatching in FIG. 2. The plane of upper faces 26 of central pillars 24 may be coplanar with plane 21 but is preferably displaced toward bottom 22 from plane 21 and substantially parallel with plane 21.

The plurality of substantially coplanar support members comprising support shelves 28, support blocks 30, support blocks 32, and support webs 34 are indicated in a left-low-to-right-high cross hatching in FIG. 2. The plane containing support members 28, 30, 32, 34 is substantially parallel with plane 21, is disposed below the plane containing upper faces 26 of central pillar 24, and is situated above bottom 22 of well 14.

Figure 3:
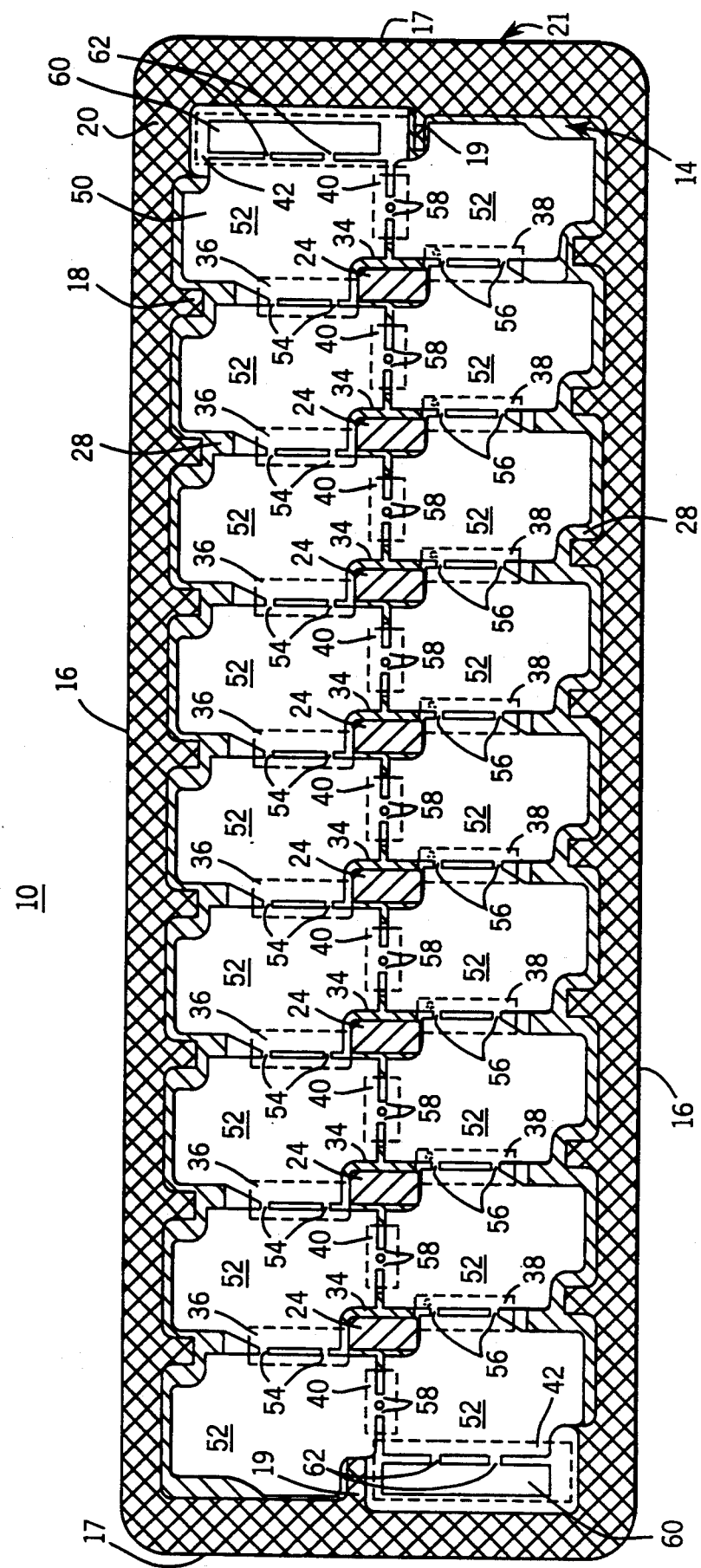
FIG. 3 is a top plan view of the preferred embodiment of the present invention with a parts array situated therein.

FIG. 3 is a top plan view of the preferred embodiment of the present invention with a parts array situated therein. In FIG. 3, a tray 10 nestlingly retains within its well 14 a parts array 50 comprising a plurality of parts 52. Parts array 50 rests on shelves 28 and other support members within well 14, such as support webs 34 and support blocks 30, 32 (not visible in FIG. 3). Parts array 50 is configured to nestingly surround central pillars 24. Parts 52 are interconnected by first lateral frangible connections 54, by second lateral frangible connections 56, and by central frangible connections 58. First transverse apertures 36 are substantially in register with first lateral frangible connections 54. Second transverse apertures 38 are substantially in register with second lateral frangible connections 56. Central apertures 40 are substantially in register with central frangible connections 58. End apertures 42 are substantially in register with scrap end pieces 60 which are each respectively connected with an adjacent part 52 via a scrap frangible connection 62.

A process employing the present invention to facilitate separation of parts 52 from parts array 50 while parts array 50 is situated within tray 10 involves the steps of (1) positioning tray 10 over a die, preferably employing guide pins to properly position tray 10 with respect to the die; (2) positioning parts array 50 within tray 10; (3) positioning the die within a press configured for performing the particular operation, having press members aligned with loci corresponding with first lateral frangible connections 54, second lateral frangible connections 56, central frangible connections 58, and scrap frangible connections 62; (4) cycling the press to punchingly sever the respective frangible connections 54, 56, 58, 62 and force scrap resulting from such punching separation through apertures 36, 38, 40, 42; (5) removing the die from the press; (6) remove the tray from the die with the individual parts 52 retained within well 14; (7) employing the tray 10 as a packaging tray for shipping the respective parts 52.

It is to be understood that, while the detailed drawings and specific examples given describe preferred embodiment of the invention, they are for the purpose of illustration, that the apparatus and method of the invention are not limited to the precise details and conditions disclosed, and that various changes may be made therein without departing from the spirit of the invention which is defined by the following claims.

I claim:

1. An apparatus and an array of parts in combination, the apparatus being configured for use in manufacturing said array of parts; said array including a plurality of said parts joined by a plurality of frangible connections at a plurality of connection sites; the apparatus in combination with the array of parts comprising:

a receptacle having a profiled upper face; said profiled upper face being configured to generally retain said array in said receptacle in a predetermined orientation, each respective part of said plurality of parts having a predetermined respective locus when said array is in said predetermined orientation; said receptacle including a plurality of apertures traversing said receptacle; said plurality of apertures being substantially in register with said plurality of connection sites when said array is in said predetermined orientation; said plurality of apertures being configured to accommodate punching severance of said plurality of frangible connections and passing of punched material from said punching severance through said plurality of apertures.

2. An apparatus and an array of parts in combination, the apparatus being configured for use in manufacturing said array of parts as recited in claim 1 wherein said profiled upper face is further configured to generally retain each said respective part in said predetermined locus after said severance.

3. An apparatus and an array of parts in combination, the apparatus being configured for use in manufacturing said array of parts as recited in claim 1 wherein said receptacle is further configured to facilitate stacking of adjacent said receptacles with said plurality of parts retained in said predetermined loci in each said adjacent receptacle.

4. An apparatus and an array of parts in combination, the apparatus being configured for use in manufacturing said array of parts as recited in claim 2 wherein said receptacle is further configured to facilitate stacking of adjacent said receptacles with said plurality of parts retained in said predetermined loci in each said adjacent receptacle.

5. An apparatus and an array of parts in combination, the apparatus being configured for use in manufacturing said array of parts as recited in claim 1 wherein said receptacle is manufactured of anti-static material.

6. An apparatus and an array of parts in combination, the apparatus being configured for use in manufacturing said array of parts as recited in claim 2 wherein said receptacle is manufactured of anti-static material.

7. An apparatus and an array of parts in combination, the apparatus being configured for use in manufacturing said array of parts as recited in claim 3 wherein said receptacle is manufactured of anti-static material.

8. An apparatus and a part in combination, the apparatus being configured for conveying said part during manufacturing and shipping of said part; said part including a plurality of sub-parts joined by a plurality of connections at a plurality of connection sites; the apparatus and the part in combination comprising:

a receptacle; said receptacle being generally oriented about a plane and having an upper profile and a lower profile, said upper profile being configured to retain said part substantially in a predetermined orientation against lateral forces generally parallel with said plane, each respective sub-part of said plurality of sub-parts having a predetermined respective locus when said part is in said predetermined orientation; said receptacle having a plurality of apertures traversing said receptacle intermediate said upper profile and said lower profile, said plurality of apertures being substantially in register with said plurality of connection sites when said part is in said predetermined orientation; each respective connection site of said plurality of connection sites having a respective registered aperture of said plurality of apertures appropriately dimensioned to accommodate traversal of said part by a severing device to effect severance of said connections when said part is in said predetermined orientation.

9. An apparatus and a part in combination, the apparatus being configured for conveying said part during manufacturing and shipping of said part as recited in claim 8 wherein said upper profile is further configured to generally retain each said respective sub-part in said predetermined locus after said severance.

10. An apparatus and a part in combination, the apparatus being configured for conveying said part during manufacturing and shipping of said part as recited in claim 8 wherein said receptacle is further configured to facilitate stacking of adjacent said receptacles with said plurality of sub-parts retained in said predetermined loci in each said adjacent receptacle.

11. An apparatus and a part in combination, the apparatus being configured for conveying said part during manufacturing and shipping of said part as recited in claim 9 wherein said receptacle is further configured to facilitate stacking of adjacent said receptacles with said plurality of sub-parts retained in said predetermined loci in each said adjacent receptacle.

12. An apparatus and a part in combination, the apparatus being configured for conveying said part during manufacturing and shipping of said part as recited in claim 8 wherein said receptacle is manufactured of anti-static material.

13. An apparatus and a part in combination, the apparatus being configured for conveying said part during manufacturing and shipping of said part as recited in claim 9 wherein said receptacle is manufactured of anti-static material.

14. An apparatus and a part in combination, the apparatus being configured for conveying said part during manufacturing and shipping of said part as recited in claim 10 wherein said receptacle is manufactured of anti-static material.

* * * * *

UNITED STATES PATENT AND TRADEMARK OFFICE
CERTIFICATE OF CORRECTION

PATENT NO. : 5,450,959
DATED : September 19, 1995
INVENTOR(S) : Philippi

It is certified that error appears in the above-indentified patent and that said Letters Patent is hereby corrected as shown below:

On the title page, item [75] Inventor: middle initial "C." should read --G.--.

Signed and Sealed this

Sixteenth Day of January, 1996

Attest:

BRUCE LEHMAN

*Attesting Officer*　　*Commissioner of Patents and Trademarks*